United States Patent [19]

Ljung et al.

[11] 4,159,075
[45] Jun. 26, 1979

[54] HERMETIC BONDED SEAL

[75] Inventors: Bo H. G. Ljung; James G. Koper, both of Wayne, N.J.

[73] Assignee: The Singer Company, Little Falls, N.J.

[21] Appl. No.: 856,714

[22] Filed: Dec. 2, 1977

[51] Int. Cl.² .............................................. B23K 21/00
[52] U.S. Cl. ..................................... 228/116; 228/121; 228/124; 228/206
[58] Field of Search .............. 228/115, 116, 121, 122, 228/124, 205, 206; 331/94.5; 134/1

[56] References Cited
U.S. PATENT DOCUMENTS

| 2,984,759 | 5/1961 | Vine | 228/115 |
|---|---|---|---|
| 3,090,116 | 5/1963 | Burgess | 228/115 |
| 3,806,365 | 4/1964 | Jacob | 134/1 |
| 3,951,327 | 4/1976 | Snow et al. | 228/121 |
| 3,999,698 | 12/1976 | Conkin | 228/122 |

OTHER PUBLICATIONS

Knudsen, "Metallic Vacuum-Tight Gasket", *Review of Scientific Instruments*, vol. 23, pp. 566-567 (1952).
Smiley, "Window Seal for Gas Lasers", *Review of Scientific Instruments*, vol. 34, p. 820 (1963).
Hochul, "GaAsCO₂ Laser Window Sealing Technique", Progress Report, NASA Grant NGR-21-002-216, Aug. 1970.

*Primary Examiner*—C. W. Lanham
*Assistant Examiner*—Kenneth J. Ramsey
*Attorney, Agent, or Firm*—L. A. Wright; T. W. Kennedy

[57] ABSTRACT

A method for providing at room temperature a hermetic bonded seal between the surfaces of glass, ceramics, metals or any combination of these. The method comprises the steps of polishing the surfaces to be bonded and then plasma cleaning the surfaces. Next, a chemically cleaned bonding material such as indium is applied to the surfaces and a force is applied to the surfaces to be sealed at room temperature for a limited period of time to affect the bonded seal.

12 Claims, 5 Drawing Figures

HERMETIC BONDED SEAL

THE PRIOR ART

U.S. Pat. No. 3,951,327, 4/1976, Snow et al.
U. Hochuli, "Review of Scientific Instruments" (Vol. 43, No. 8, August 1972).
A. Roth, "Vacuum Sealing Technique", page 329 (Pergamon Press 1966).

This invention is related to a method of making a hermetic bonded seal. More particularly, the invention relates to making a hard vacuum bonded seal such as would be required in ring laser gyroscopes.

BACKGROUND OF THE INVENTION

The ring laser gyros taught by the prior art have used epoxy for hermetic bonding of components. Although this method is simple to effect, it has been found that epoxy does not provide a suitable seal for ring laser gyros because of high outgassing and water vapor permeability and it is no longer commonly applied in this environment.

At present, the most commonly used method of hermetic bonding is by vacuuming soldering of premetallized surfaces. This method was first described by U. Hochuli in the Review of Scientific Instruments (Volume 43, No. 8, August 1972). The interface surfaces of the components to be hermetically bonded are first metallized with a thin film of gold. This is usually done by high temperature air firing of a liquid gold resin sprayed on the surface. The components are then held together and placed in a high vacuum oven where the entire instrument is heated to approximately 200° C. Indium solder is then allowed to flow into the seal interface dissolving the gold film and forming a bond.

The method of bonding seal in building ring laser gyros (RLG's) taught by the prior art has several drawbacks. It requires very involved surface preparation, a high temperature gold firing process, involved vacuum oven soldering, and the requirement of elaborate fixturing. It has been found that the reliability of the process is relatively poor. The thin film fired-on gold metallization process is quite difficult to control in that many materials and other factors determine the outcome. Among problem areas are: difficult control of coating thickness (too much thickness results in flaking) and too little thickness results in a poor seal. It has been found that at least two layers of gold are required for a good seal. Even then, the outcome depends on the type of thinner, eveness of coat, age and condition of the gold resin, drying temperature, firing temperature, rate of temperature increase, hold time, smoothness of surface, and oxygen contents in the firing oven. Some materials, such as Pyrex, don't tolerate the high firing temperature of approximately 700° C. that is necessary. The resulting gold film is highly susceptible to scratching during handling. This causes leaks in the resulting seal making it necessary to repeat the entire gold coating/indium sealing process. Also, this process cannot bond materials such as aluminum to glass ceramics. This is because of the well-known problem with intermetallics (purple plague) that prevents gold to aluminum bonds.

A. Roth describes in "Vacuum Sealing Techniques", page 329 (1966 Pergamon Press) the use of indium wire as a gasket held in constant compression in hermetic sealing. In this form, the indium served the same function as a rubber gasket in that it provides a sealing medium with no bonding properties. The parts are held together with bolts and/or spring clamps, i.e., a standard compression flange design.

In U.S. Pat. No. 3,951,326, Snow et al teaches another bonded seal method. The method taught therein makes use of the well-known fact that aluminum compression seals when heated during compression will bond to seal surfaces. Snow et al apply this seal method to a microcircuit package. The method taught by Snow et al would not be applicable to RLG's seals because of the high pressure required as well as the high temperature requirement. Although Snow et al mentions copper, platinum, gold, silver and titanium as seal materials in their device, indium and its alloys are not taught by them. Nor do Snow et al teach plasma cleaning and the requirement for a smooth surface finish on the parts to be bonded.

BRIEF DESCRIPTION OF THE INVENTION

The present invention provides a method for room temperature hermetic bonded seals which have important uses in, but not limited to, ring laser gyroscopes. The method comprises the steps of plasma cleaning of the surfaces to be bonded; second, polishing the surfaces in order that the surfaces are free of scratches; third, positioning a chemically cleaned indium wire on the surfaces and applying pressure to the bonding surface at room temperature to effect the bond.

Accordingly, it is an object of this invention to provide a hard vacuum hermetic bonded seal.

This and other objects, features and advantages of the present invention will become apparent from the following description taken in conjunction with the accompanying drawings wherein.

The bonded seal of the present invention is usable in the many areas where a hard vacuum is required. One particular use is in ring laser gyroscope (RLG's). RLG's are made from materials of widely different thermal expansion properties, such as aluminum and ultra low expansion glass ceramics such as Cer Vit, manufactured by Owings, Illinois and Zerodur, manufactured by Schott Optical. Further, these RLG materials and/or coatings do not endure high temperatures. The present invention provides hermetic bonded seals for RLG's and other applications that are formed under room temperature conditions. The bonded seals made in the manner of the invention has special applicability in the fabrication of gas bearing gyroscopes and other instruments where confined volumes must be filled with gas and then sealed, and where epoxy seals and Viton O-ring seals (manufactured by DuPont) do not provide enough freedom from leaks and outgassing or where flotation fluid interaction is detrimental.

Figure 1:
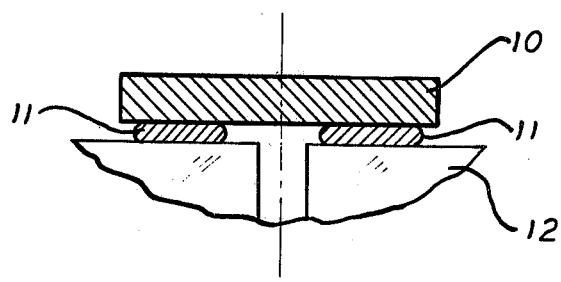
FIG. 1 is a cross-sectional view of two surfaces to be bonded with the bonding material positioned between the surfaces.
Figure 2A:
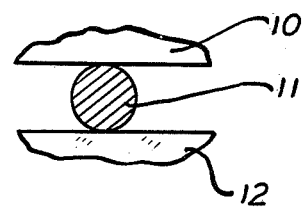
FIGS. 2a and 2b are detailed views of FIG. 1 showing the diameter of the bonding material before and after compression.
Figure 2B:
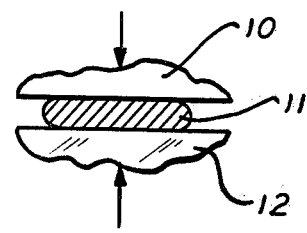

Turning to FIGS. 1, 2a and 2b, there is shown a bonded seal made in accordance with the teaching of the invention. In the illustration a metallic material 10 is shown bonded to a ceramic material 12. It is understood that the bonding method of the invention is equally effective in bonding glass to glass, ceramic to ceramic or metal to metal. In preparing the bonding of metallic material 10 to ceramic material 12, the surfaces of both materials which are to be bonded are highly polished so that the mating surfaces of both 10 and 12 are free from scratches extending across the bonded seal area. The mating surfaces of materials 10 and 12 are then plasma cleaned. A plasma cleaner of 97% He and 3% $O_2$ is used as a reaction gas in a reaction chamber which is excited with 300 W high frequency radio power. The surfaces of material 10 and 12 remain in the reaction chamber for approximately four minutes. Next, the bonding seal material made of indium wire 11 tied into a loop is chemically cleaned in solvents such as freon TF (trichlorofloroethane) and then etched for a few minutes in a solution of 50% HCl (hydrochloric acid). Immediately after cleaning (but no later than one hour after cleaning) the seal is fabricated. This is accomplished by routing the indium wire in the place where the bond is to be made. The end points of the indium wire 11 are simply sealed by crossing the indium wire over itself. After the indium wire 11 is in its place on the surfaces of materials 10 and 12, pressure is applied to the sealing surfaces. It has been found that a 0.6 mm diameter wire as shown in FIG. 2A is deformed to 0.1 mm by a force of approximately 100 Newtons per cm length of wire. FIG. 2b shows wire 11 in the deformed state.

The length of time at which the pressure is applied to the bonding surfaces has not been shown to be particularly significant. However, in the present method the pressure is applied to the bonding surfaces for approximately five minutes. The high deformation and flow that makes the wire spread out to a width of 2–3 mm causes fresh unoxidized indium to flow out and contact the highly cleaned surfaces to be bonded. This process causes the indium to bond very well to most materials such as glass, glass-ceramics, metals, even oxidized aluminum. The bonding forces in the method of the invention are usually in the order of 100 Newtons/cm. Because the indium bonded seal recrystallizes at temperatures even below room temperature, any mismatch in thermal expansion or any residual stresses from the bonding will simply disappear.

Figure 3:
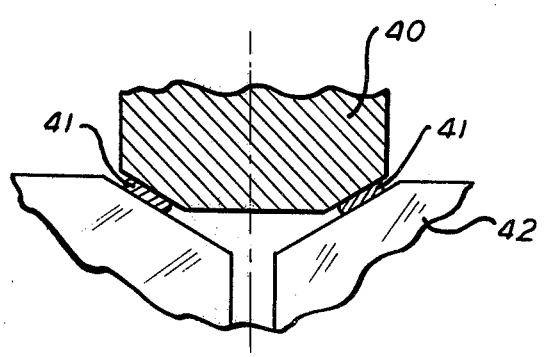
FIG. 3 is a partial cross-sectional view showing the hermetic bonded seal as applied to polished conical or spherical surfaces.

FIG. 3 is a cross-sectional view illustrating the hermetic bonded seal 41 as applied to surfaces 40 and 42. Surfaces 40 and 42 may be conical or spherical surfaces.

Figure 4:
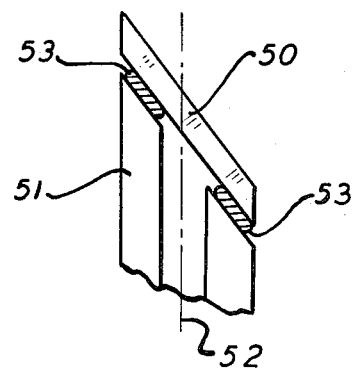
FIG. 4 is a partial view in cross-section of the hermetic bonded seal as applied to a Brewster angle window positioned on a laser cavity.

FIG. 4 illustrates the hermetic bonded seal 53 as applied to a Brewster angle window 50 on a laser cavity 51. Even with mismatch between thermal expansion between the fused quartz used in window 50, the indium 53 and laser body 51 made from Zerodur, there is no detected stress birefringence. This proves that low loss laser cavities can be built using the bonding method of the invention.

From the foregoing, a method of achieving a high strength hermetic bonded seal between any configuration of polished glasses, ceramics and metals at room temperature has been described. Although only preferred embodiments of the present invention have been described herein, it is not intended that the invention be restricted thereto, but is limited only by the true spirit and scope of the appended claims.

We claim:

1. The method of making a high strength hermetic bonded seal comprising:
   cleaning the surfaces to be bonded with a plasma cleaner,
   positioning an indium wire on the surfaces to be bonded together, and
   applying pressure to the bonding surface at room temperature so as to effect a bonded seal between said surfaces.

2. The method of claim 1 comprising:
   chemically cleaning said indium wire prior to positioning said indium wire on said surfaces.

3. The method of claim 2 comprising:
   polishing said surfaces to be bonded so that they are substantially free of scratches.

4. The method of claim 3 comprising:
   bonding a glass material to a ceramic material.

5. The method of claim 4 comprising:
   bonding a ceramic material to a metallic material.

6. The method of claim 5 comprising:
   bonding glass surfaces.

7. The method of claim 5 comprising:
   bonding ceramic surfaces.

8. The method of claim 7 comprising:
   bonding metallic surfaces.

9. The method of making a high strength hermetic bonded seal between ceramic and metallic surfaces comprising:
   cleaning the surfaces to be bonded with a plasma cleaner,
   polishing said surfaces to be bonded so that said surfaces are substantially free of scratches,
   positioning an indium wire on said surfaces to be bonded together, and
   applying pressure to the bonding surface at room temperature so as to effect a bonded seal between said surfaces.

10. The method of making a high strength hermetic bonded seal between ceramic and metallic surfaces comprising:
    cleaning the surfaces to be bonded with a plasma cleaner,
    polishing said surfaces to be bonded so that said surfaces are substantially free of scratches,
    chemically cleaning an indium wire for use in bonding said surfaces in a solvent made of freon and then etching said wire in a solution of hydrochloric acid,
    positioning said indium wire on said surfaces to be bonded together, and
    applying pressure to the bonding surface at room temperature so as to effect a bonded seal between said surfaces.

11. The method of claim 13 comprising:
    positioning an indium wire having a diameter of 0.6 mm between said surfaces, and
    applying a force to said surfaces at room temperature of approximately 100 Newton per cm length of wire.

12. The method of making a high strength hermetic bonded seal comprising:
    cleaning the surfaces to be bonded with a plasma consisting of a reaction gas of 97% He and 3% $O_2$ while
    subjecting said surfaces to a 300 W high frequency radio power in a reaction chamber for approximately four minutes,
    positioning an indium wire on the surfaces to be bonded together, and
    applying pressure to the bonding surface at room temperature so as to effect a bonded seal between said surfaces.

* * * * *